United States Patent
Choi

(10) Patent No.: US 8,302,035 B2
(45) Date of Patent: Oct. 30, 2012

(54) METHOD FOR VERIFYING OPTICAL PROXIMITY CORRECTION

(75) Inventor: Jin Young Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 210 days.

(21) Appl. No.: 12/825,835

(22) Filed: Jun. 29, 2010

(65) Prior Publication Data

US 2011/0004855 A1 Jan. 6, 2011

(30) Foreign Application Priority Data

Jul. 1, 2009 (KR) .................. 10-2009-0059918

(51) Int. Cl.
*G06F 17/50* (2006.01)
(52) U.S. Cl. .......... 716/53; 716/50; 716/51; 716/52; 716/54; 716/55; 430/5; 430/30
(58) Field of Classification Search .......... 716/50–55; 430/5, 30
See application file for complete search history.

(56) References Cited

U.S. PATENT DOCUMENTS

| | | | |
|---|---|---|---|
| 6,553,559 B2 | 4/2003 | Liebmann et al. | |
| 7,165,234 B2 | 1/2007 | Pierrat | |
| 7,194,704 B2 * | 3/2007 | Kotani et al. | 716/52 |
| 7,434,197 B1 * | 10/2008 | Dolainsky et al. | 716/53 |
| 7,536,660 B2 | 5/2009 | Adam | |
| 7,642,019 B2 * | 1/2010 | Kim | 430/30 |
| 7,853,920 B2 * | 12/2010 | Preil et al. | 716/52 |
| 7,954,072 B2 * | 5/2011 | Liu et al. | 716/54 |
| 2004/0128118 A1 | 7/2004 | Croffie et al. | |

* cited by examiner

*Primary Examiner* — Nghia Doan
(74) *Attorney, Agent, or Firm* — Ladas & Parry LLP

(57) ABSTRACT

A method for verifying an optical proximity correction includes: performing an optical proximity correction on a target pattern layout; performing a primary verification on the target pattern layout which has undergone the optical proximity correction; performing a secondary verification on defect weak points detected in the primary verification; and performing an additional optical proximity correction on hot spot points which are detected in the secondary verification and which may be generated as defects when transferred to a real wafer.

19 Claims, 4 Drawing Sheets

|  | DOSE VARIATION(%) -4 | DOSE VARIATION(%) 0 | DOSE VARIATION(%) 4 |
|---|---|---|---|
| FOCUS:=-170 | 0/0 | 6/0 | 0/0 |
| FOCUS:=-120 | 6/0 | 6/0 | 6/0 |
| FOCUS:=-70 | 0/0 | 6/0 | 0/0 |

(a) NECKING DEFECT

| | DOSE VARIATION(%) -4 | DOSE VARIATION(%) 0 | DOSE VARIATION(%) 4 |
|---|---|---|---|
| FOCUS:=-170 | | 12639 | |
| FOCUS:=-120 | 12406 | 12674 | 12692 |
| FOCUS:=-70 | | 14088 | |

(b) BRIDGE DEFECT

| | DOSE VARIATION(%) -4 | DOSE VARIATION(%) 0 | DOSE VARIATION(%) 4 |
|---|---|---|---|
| FOCUS:=-170 | | 11064 | |
| FOCUS:=-120 | 12033 | 11324 | 10953 |
| FOCUS:=-70 | | 11384 | |

METHOD FOR VERIFYING OPTICAL PROXIMITY CORRECTION

CROSS-REFERENCES TO RELATED APPLICATIONS

The present application claims priority under 35 U.S.C 119(a) to Korean application number 10-2009-0059918, filed on Jul. 1, 2009, in the Korean intellectual property Office, which is incorporated herein by reference in its entirety set forth in full.

BACKGROUND

Exemplary embodiments of the present invention relate generally to a method for fabricating a semiconductor device, and more particularly, to a method for verifying an optical proximity correction (OPC).

Semiconductor memory devices, such as dynamic random access memory (DRAM), include a large number of fine patterns. Such fine patterns are formed through a photolithography process. According to the lithography process, a target film to be patterned is coated with a resist film, and a photomask in which circuit patterns to be transferred to a wafer are formed is disposed on the resist film. Then, the circuit patterns formed on the photomask are transferred to the resist film through an exposure process and a development process, thereby forming resist patterns partially exposing the surface of the target film. Subsequently, the exposed regions of the target film are removed by an etching process using the resist patterns as a mask, and the resist patterns are then stripped. In this manner, the fine patterns of the semiconductor memory device can be formed.

In order to satisfy demands for speed, functionality and capacity, high integration of the semiconductor device is required. However, when a semiconductor device is highly integrated, the design rule is reduced and the line width becomes close to an exposure wavelength, and thus it becomes difficult to implement the patterns as arranged in the design layout. One of the reasons for difficulty in implementing the patterns as arranged in the design layout is the optical proximity effect (OPE) which occurs during the exposure process. It can be understood that the optical proximity effect is derived from pattern deformation caused by nonuniformity of energy intensity due to optical diffraction during the exposure process. Therefore, optical proximity correction is used to solve pattern deformation caused by the optical proximity effect. Optical proximity correction is the process of correcting the layout of target patterns to be transferred onto a wafer using knowledge of the optical proximity effect.

Specifically, the layout of patterns to be transferred onto the wafer is designed, and the optical proximity correction is performed on the designed layout. Then, suitability is determined by verifying the performed optical proximity correction, and the pattern layout is applied to real patterns. The verification step is a step of detecting weak points in which defects affecting the device fabrication, for example, necking defects or bridge defects, may be formed.

In the verification step, weak points vulnerable to defects are generally detected using the critical dimension (CD) of simulated patterns. In the case of using the CD of patterns, a plurality of weak points are detected. Points where real defects may be formed are determined manually by a worker. However, determining defect weak points manually has limitations, including the amount of time necessary to perform such a determination. Also, since a CD trend and a process margin trend do not always coincide with each other, the use of the CD is not always accurate in determining the weak points where defects may actually occur. That is, the accuracy of a verification model is important in order to exactly predict defect weak points, and there is a need for a system which can exactly detect the defect weak points.

SUMMARY

In one embodiment, a method for verifying an optical proximity correction of a target pattern layout includes: performing an optical proximity correction on the target pattern layout; performing a primary verification on the target pattern layout which has undergone the optical proximity correction; performing a secondary verification on defect weak points detected in the primary verification; and performing an additional optical proximity correction on hot spot points which are detected in the secondary verification and which may be generated as defects when transferred to a real wafer.

The primary verification may include: setting a reference point of focus and exposure lattice values with respect to the target pattern layout which has undergone the optical proximity correction; setting a verification range by dividing the focus and exposure latitude values from the reference point on the basis of a predetermined unit; setting a critical dimension (CD) tolerance at which defects do not occur with respect to the set verification range; and extracting points, which are out of the CD tolerance, as defect weak points.

The reference point may be a point which has focus and exposure latitude values at which the target pattern layout having undergone the optical proximity correction is implemented on a wafer in a desired shape.

The secondary verification may be performed on the reference point of the focus and exposure latitude values at the defect weak points detected in the primary verification.

The secondary verification may include: simulating and calculating values whose process conditions are varied with respect to the defect weak points detected in the primary verification; creating an exposure defocus (ED) tree, which comprises a CD tolerance at which defects do not occur, by using the calculated values; calculating process window values within the CD tolerance of target patterns to be formed on a wafer in the ED tree; sorting the calculated process window values; and detecting hot spot points which are defects to be formed on a real wafer within the sorted process window values.

The process conditions may include CD variation values based on focuses and CD variation values based on doses.

The values may be calculated by setting a wider range than the focus and dose variation values which are set in order to perform the primary verification.

The calculating of the process window values may include: dividing the ED tree into polygons; and calculating areas of the polygons of regions existing within the CD tolerance of the target patterns to be formed on the wafer.

The ED tree may include the CD variation values based on the focus and dose values.

The calculated process window values may be sorted based on shapes of the defects or sizes of the CD.

The hot spot points may be patterns having the smallest value among the sorted process window values.

BRIEF DESCRIPTION OF THE DRAWINGS

The above and other aspects, features and other advantages will be more clearly understood from the following detailed description taken in conjunction with the accompanying drawings, in which:

FIGS. 2 to 4 are diagrams for explaining a method for setting a verification range for detection of defects.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
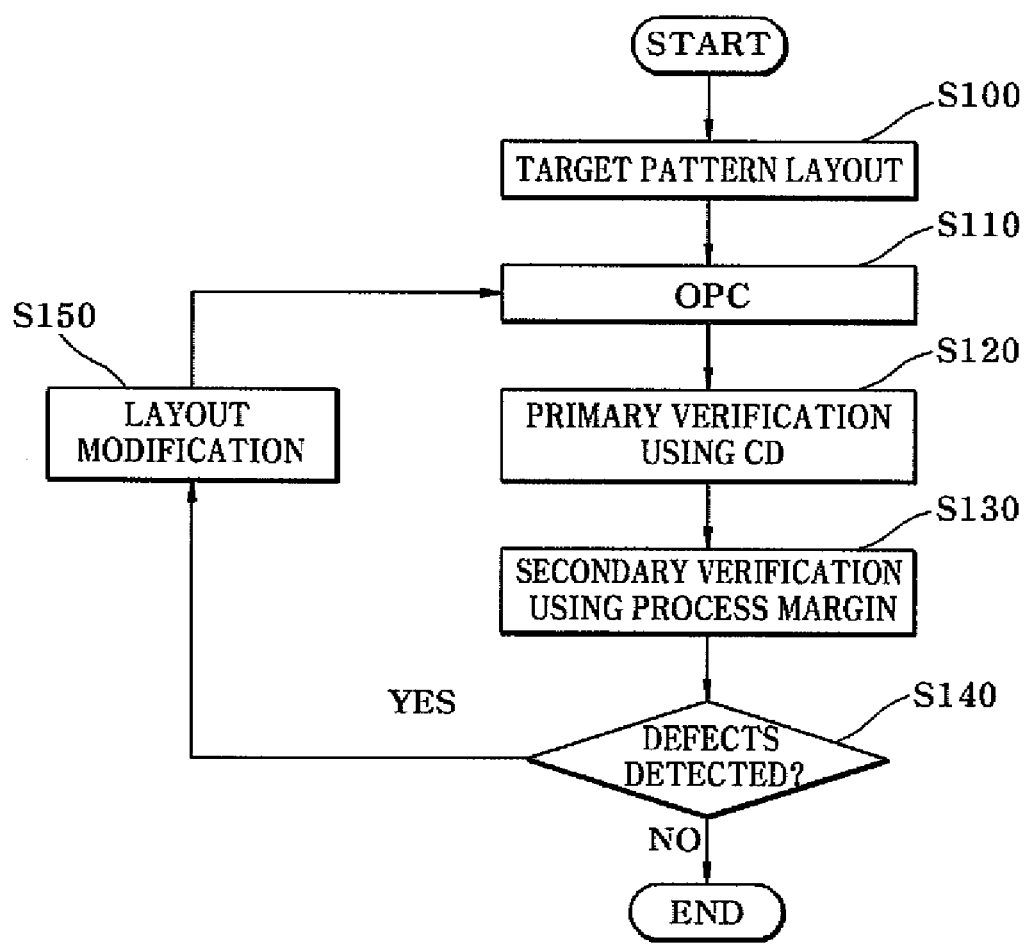
FIG. 1 is a flowchart for explaining a method for verifying an optical proximity correction according to an embodiment of the present invention.
Figures 2, 3:
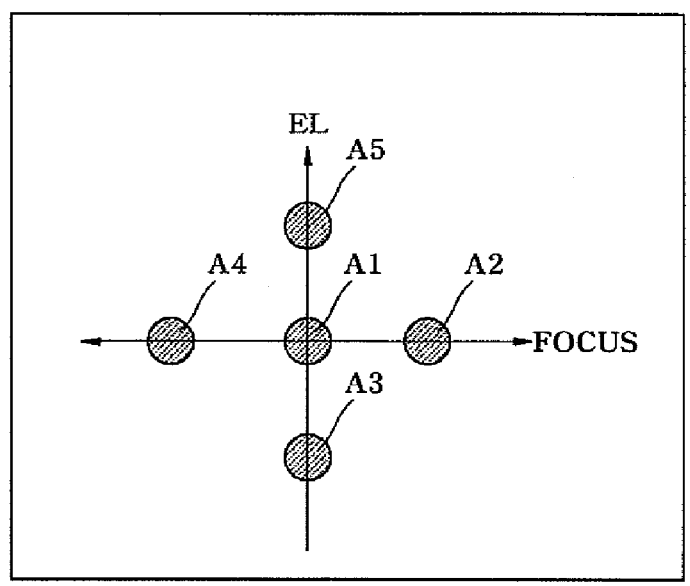
Figure 5:
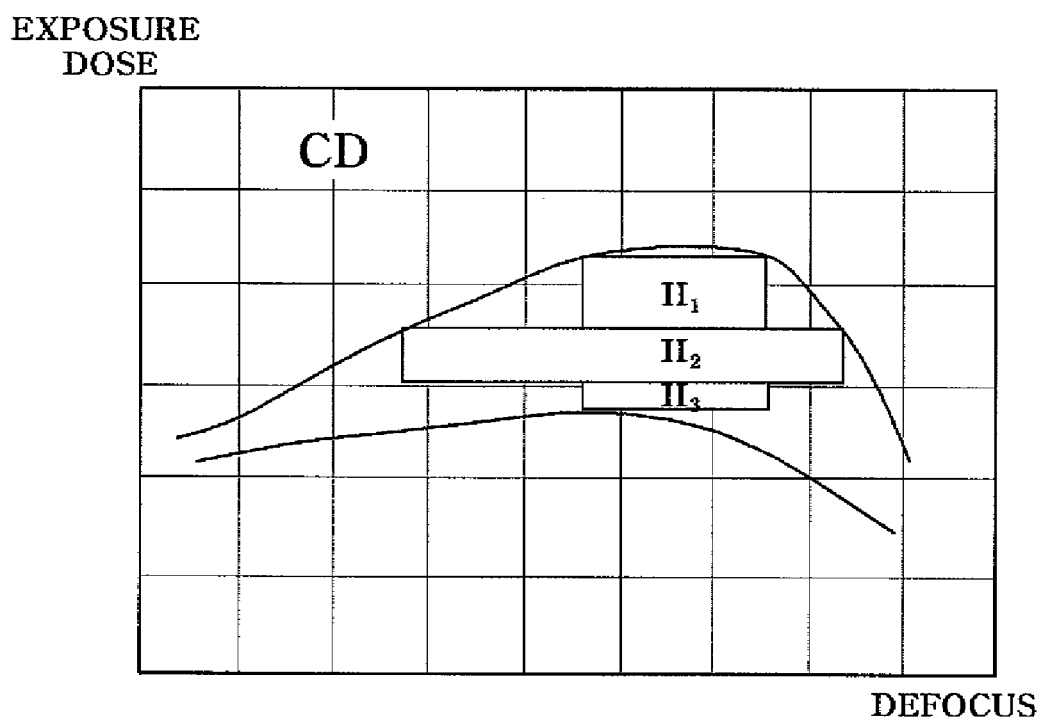
FIG. 5 is a diagram showing an exposure defocus (ED) tree of a process window.

FIG. 1 is a flowchart for explaining a method for verifying an optical proximity correction according to an embodiment of the present invention. FIGS. 2 to 4 are diagrams for explaining a method for setting a verification range for detection of defects. FIG. 5 is a diagram showing an exposure defocus (ED) tree of a process window.

Referring to FIG. 1, a method for verifying an optical proximity correction (OPC) according to an embodiment of the present invention is performed after step S100 of designing a target pattern layout to be transferred to a wafer. The target pattern layout is designed with a layout of patterns to be actually implemented on a wafer. The target patterns may be patterns applied to, for example, a DRAM device, a flash device, an SRAM device, and a logic device. Also, although the target pattern layout is not shown in the drawings, it may be formed by selecting one or more patterns from a group consisting of patterns such as line patterns, hole patterns, island patterns, and space patterns.

After designing the target pattern layout to be transferred onto the wafer, an optical proximity correction for compensating for an optical proximity effect (OPE) is performed on the target pattern layout at step S110. The optical proximity correction creates an exposure model in consideration of the OPE which may occur during an actual exposure process. In one example of optical proximity correction, a simulation model for exposure and development of a photoresist may be created, and an optical proximity correction may be performed in accordance with a model base scheme using the simulation model. Another example is rule based optical proximity correction in which various geometries are treated by different rules.

At step S120, a primary verification step using a CD is performed on the layout which has undergone the optical proximity correction. In the verification step, whether the optical proximity correction is suitably or effectively performed is determined by comparing an original database of an initial pattern layout designed and drawn by a designer with the pattern layout which has undergone the optical proximity correction. Then, weak points in which defects affecting device fabrication may be formed are detected.

The primary verification step for the layout which has undergone the optical proximity correction is performed using a CD. To this end, as illustrated in FIG. 2, verification ranges A2, A3, A4 and A5 are set by setting a focus value and an exposure latitude (EL) value at predetermined ranges from the best condition A1, with respect to the pattern layout which has undergone the optical proximity correction. In the case in which the pattern layout is transferred onto the wafer, the best condition A1 is defined as the condition having a focus value and an exposure latitude value at which the transferred patterns are implemented exactly in the desired pattern shape. Exposure dose variations based on focus variations may be given as shown in FIG. 3. The focus and exposure dose variations of condition "B" are the best condition in which the optical proximity correction has been exactly performed.

Types of defects, for example, necking defects or bridge defects, are set; and CD tolerance at which no defects occur is set. Defect weak points are extracted from the CD tolerance. For example, the worker sets the CD tolerance so that defects are detected as necking defects when the CD of the line pattern is 145 nm or less. The worker sets the CD tolerance so that defects are detected as bridge defects when the CD of the space pattern is 130 nm or less.

Next, the number of points outside of the CD tolerance in the verification range in which the focus and the exposure dose in FIG. 3 are varied (that is, the number of defect weak points detected as defects) are detected and confirmed. In the case where the measured CD of the simulated pattern is outside of the CD tolerance, the corresponding pattern may be detected as a defect. As illustrated in FIG. 4, the number of the defect weak points (a) in which the necking defects occur and the number of the defect weak points in which the bridge defects occur are detected under the environment in which the respective focuses and exposure doses are varied. In the case illustrated in FIG. 4, the primary verification, which detects the defect weak points by using the CD of the patterns, detected 12,674 necking defects and 11,324 bridge defects at portion "I" in which the focus and the exposure dose are set to the best condition. When attempting to extract the points where defects may actually occur on the wafer (that is, hot spot points) in such a state in which a plurality of weak points were detected, the hot spot points have been extracted manually by a worker making the determination based on experience. However, having a worker determine the hot spot points to be extracted requires a relatively large amount of time and further the reliability of extraction is not ideal. Therefore, in an embodiment of the present invention, an additional verification is performed in order to increase the accuracy of the extraction of hot spot points.

To this end, at step S130, a secondary verification is performed on the defect weak points detected by the primary verification performed using the CD. The secondary verification on the defect weak points is performed using a process window. The process window refers to a combination of process parameters affecting semiconductor device fabrication. Examples of the process parameters include an overlay, a macro defect, and a micro defect. The process parameters affecting device fabrication (for example, affecting the occurrence of defects) can be measured by using equipment to predict the patterning results of the semiconductor device.

Specifically, in an embodiment, the CD variation values based on focuses and the CD variation values based on doses are simulated with respect to the defect weak points detected in FIG. 4 and then calculated. The secondary verification to be performed on the defect weak points may be performed on the portion "I" (see FIG. 4) in which the focus and the exposure dose are set to the best condition. In this case, the CD variation values based on focuses and the CD variation values based on doses with respect to the defect weak points may be set in a verification range wider than the focus and dose variation values set in order to set the verification range in FIG. 2.

Next, as illustrated in FIG. 5, an exposure defocus (ED) tree is created using the CD variation values based on focuses and the CD variation values based on doses. The ED tree represents the CD variation values based on the focus and dose values in graph form.

In such an ED tree, the process window values are obtained by calculating areas of polygons $II_1$, $II_2$ and $II_3$ existing within the CD tolerance. At step S140, the calculated process window values are sorted based on shapes of defects or sizes of CD, and the hot spot points (points where defects may actually occur in the wafer) are detected. Specifically, when the process window values are calculated in the ED tree, the reference is determined by the CD tolerance (%) with respect to the target CD value. For example, when the permissible range of variation of the target CD value is plus or minus 10% with respect to a pattern whose target CD value is 100 nm (that is, 10% is set as the CD tolerance) and the secondary verification is performed, the areas are calculated with respect to the regions in which the CD value is within the CD tolerance in the ED tree, that is, in the range of 90 nm to 110 nm. Different process window values are calculated with reference to the same CD tolerance of 10% depending on the types of the patterns. When the process window values are sorted in order of magnitude, the pattern having the smallest process window value may be detected as the hot spot point which is most vulnerable to a defect.

At step S150, when defects are detected, the layout is modified. The optical proximity correction is again performed, and the verification step is performed. When defects are no longer detected, the process is completed.

The secondary verification through the calculation of process window values is performed on the defect weak points detected by the primary verification in which the CD is used. In this manner, a secondary filtering with respect to the defect weak points is possible, thereby increasing the accuracy of detection of real defects which may actually be formed on the real wafer. That is, when the verification is performed using only the CD, only a single point can be verified. However, the verification through the calculation of the process window can verify a wider area, as compared to the verification based on the CD by using ED tree.

Examples of semiconductor devices to which embodiments of the present invention may be applied include semiconductor devices exposed by I-line, KrF, ArF, ArFi or EUV wavelength, or semiconductor devices to which a binary mask, an attenuation mask, an alternate mask, or a CPL mask is applied. In addition, embodiments of the present invention may be applied to the verification of semiconductor devices to which annular, quadruple, cross-pole, dipole, or conventional illumination systems are applied. It should be understood, however, that the application of embodiments of the present invention is not limited solely to these semiconductor devices.

According to the embodiments of the present invention, the accuracy of detection of hot spot points can be improved through a two-step verification method. Moreover, the total driving time is not greatly increased because the additional verification is performed only on the points detected in the first step.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for verifying an optical proximity correction of a target pattern layout, the method comprising:
performing an optical proximity correction on the target pattern layout;
performing a primary verification on the target pattern layout which has undergone the optical proximity correction to detect defect weak points, the primary verification comprising:
setting a reference point of focus and exposure latitude values with respect to the target pattern layout which has undergone the optical proximity correction;
setting a verification range by setting focus and exposure latitude values at predetermined ranges from the reference point;
setting a critical dimension (CD) tolerance at which defects do not occur with respect to the set verification range; and
extracting points, which are out of the CD tolerance, as defect weak points;
performing a secondary verification on the defect weak points detected in the primary verification to detect hot spot points;
performing an additional optical proximity correction on the hot spot points which are detected in the secondary verification;
correcting the target pattern layout when defect weak points are detected; and
transferring the corrected target pattern layout onto a wafer.

2. The method of claim 1, wherein the reference point is a point which has focus and exposure latitude values at which the target pattern layout having undergone the optical proximity correction is implemented on a wafer in a desired shape.

3. The method of claim 1, wherein the values whose process conditions is determined the secondary verification is performed on the reference point of the focus and exposure latitude values at the defect weak points detected in the primary verification.

4. A method for verifying an optical proximity correction of a target pattern layout, the method comprising:
performing an optical proximity correction on the target pattern layout;
performing a primary verification on the target pattern layout which has undergone the optical proximity correction to detect defect weak points;
performing a secondary verification on the defect weak points detected in the primary verification to detect hot spot points; the secondary verification comprising:
determining values whose process conditions are varied with respect to the defect weak points detected in the primary verification;
creating an exposure defocus (ED) tree, which comprises a CD tolerance at which defects do not occur, by using the calculated values;
calculating process window values within the CD tolerance of target patterns to be formed on a wafer in the ED tree;
sorting the calculated process window values; and
detecting hot spot points, which signify defects to be formed on a real wafer, within the sorted process window values;
performing an additional optical proximity correction on the hot spot points;
correcting the target pattern layout when defect weak points are detected; and
transferring the corrected target pattern layout onto a wafer.

5. The method of claim 4, wherein the process conditions comprise CD variation values based on focuses and CD variation values based on doses.

6. The method of claim 4, wherein the values are calculated by setting a wider range than the focus and dose variation values which are set in order to perform the primary verification.

7. The method of claim 4, wherein the calculating of the process window values comprises:
dividing the ED tree into polygons; and
calculating areas of the polygons of regions existing within the CD tolerance of the target patterns to be formed on the wafer.

8. The method of claim 4, wherein the ED tree comprises the CD variation values based on the focus and dose values.

9. The method of claim 4, wherein the calculated process window values are sorted based on shapes of the defects or sizes of the CD.

10. The method of claim 4, wherein the hot spot points are patterns having the smallest value among the sorted process window values.

11. A method for verifying an optical proximity correction of a target pattern layout, the method comprising:
performing an optical proximity correction on the target pattern layout;
setting a reference point of focus and exposure latitude values with respect to the target pattern layout which has undergone the optical proximity correction;
setting a critical dimension (CD) tolerance at which defects do not occur with respect to the set verification range;
extracting points, which are out of the CD tolerance, as defect weak points;
determining values whose process conditions are varied with respect to the defect weak points;
creating an exposure defocus (ED) tree, which comprises a CD tolerance at which defects do not occur, by using the calculated values;
calculating process window values within the CD tolerance of target patterns to be formed on a wafer in the ED tree;
sorting the calculated process window values;
detecting hot spot points, which signify defects to be formed on a real wafer, within the sorted process window values;
performing an additional optical proximity correction on the hot spot points;
correcting the target pattern layout when defect weak points are detected; and
transferring the corrected target pattern layout onto a wafer.

12. The method of claim 11, wherein the reference point is a point which has focus and exposure latitude values at which the target pattern layout having undergone the optical proximity correction is implemented on a wafer in a desired shape.

13. The method of claim 11, wherein the values whose process conditions is determined on the reference point of the focus and exposure latitude values at the defect weak points.

14. The method of claim 11, wherein the process conditions comprise CD variation values based on focuses and CD variation values based on doses.

15. The method of claim 11, wherein the values are calculated by setting a wider range than the focus and dose variation values which are set in order to extract the defect weak points.

16. The method of claim 11, wherein the calculating of the process window values comprises:
dividing the ED tree into polygons; and
calculating areas of the polygons of regions existing within the CD tolerance of the target patterns to be formed on the wafer.

17. The method of claim 11, wherein the ED tree comprises the CD variation values based on the focus and dose values.

18. The method of claim 11, wherein the calculated process window values are sorted based on shapes of the defects or sizes of the CD.

19. The method of claim 11, wherein the hot spot points are patterns having the smallest value among the sorted process window values.

* * * * *